United States Patent [19]
Holbeche et al.

[11] Patent Number: 5,798,910
[45] Date of Patent: Aug. 25, 1998

[54] SEALABLE HOUSING FOR ELECTRICAL COMPONENTS

[75] Inventors: George L. Holbeche, Oakville; Bernard C. Moore, Burlington; David R. Ten Eycke, Oakville; Carl D. Williams, Waterdown, all of Canada

[73] Assignee: Caloritech Inc., Oakville, Canada

[21] Appl. No.: 697,779

[22] Filed: Aug. 29, 1996

[51] Int. Cl.$^6$ .................. H05K 5/02; H05K 5/06
[52] U.S. Cl. .................. 361/809; 361/807; 174/50.51; 174/50.54; 174/52.1; 174/52.3
[58] Field of Search .................. 361/600, 679, 361/730, 736, 749, 752, 807, 809, 820; 174/52.1, 52.3, 52.5, 65 R, 50.5, 50.51, 50.52, 50.54, 50.57, 50.63; 220/88.1

[56] References Cited

U.S. PATENT DOCUMENTS

| | | | |
|---|---|---|---|
| 3,436,775 | 4/1969 | Schlosser et al. | 174/52.1 |
| 4,922,199 | 5/1990 | Fukui et al. | 361/749 |
| 5,113,316 | 5/1992 | Navarro et al. | 361/749 |
| 5,630,461 | 5/1997 | CoChimin | 164/34 |
| 5,656,782 | 8/1997 | Powell, II et al. | 73/756 |
| 5,675,120 | 10/1997 | Craft et al. | 174/52.1 |

OTHER PUBLICATIONS

The Condensed Chemical Dictionary, 9th ed., G.G. Hawley, editor, Van Nostrand Reinhold, p. 393, 1977.

Primary Examiner—Leo P. Picard
Assistant Examiner—John B. Vigushin
Attorney, Agent, or Firm—Patrick J. Hofbauer

[57] ABSTRACT

A sealable housing for electrical components comprises an extruded main body having a first end and a second end, the extruded main body defining a longitudinal axis and having an outer wall and a substantially cylindrical bore. Two end caps are removably sealably attached to a respective one of the first and second ends of the extruded main body to define, together with the substantially cylindrical bore, an electrical component chamber. Thickened longitudinal outer wall segments extend radially outwardly from the cylindrical bore. The electrical components are mounted within the electrical component chamber by being conventionally attached to a trolley, which trolley is longitudinally interfitted to a mounting track contiguous with the extruded main body. The extruded main body is preferably constructed from aluminum.

27 Claims, 9 Drawing Sheets

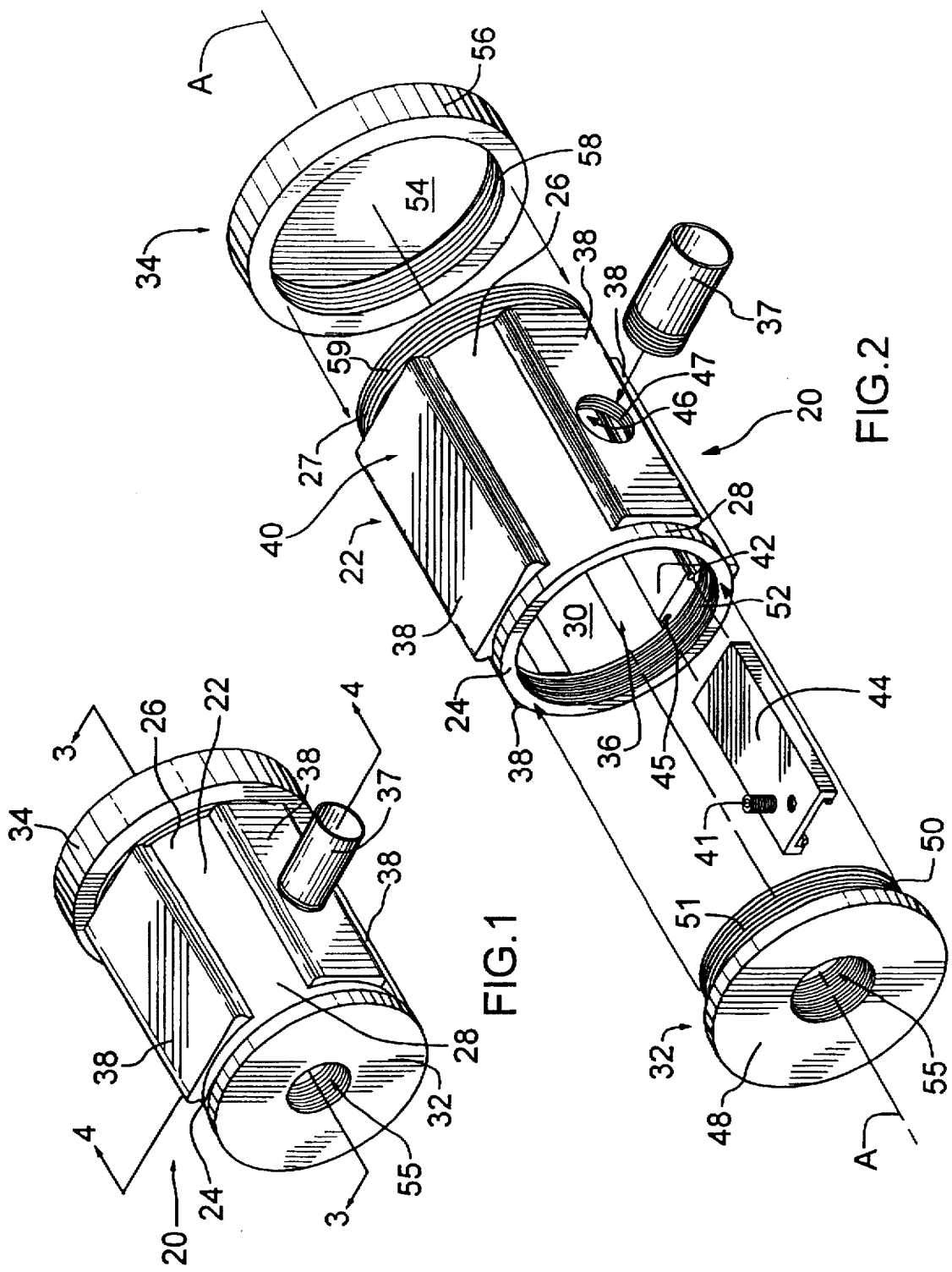

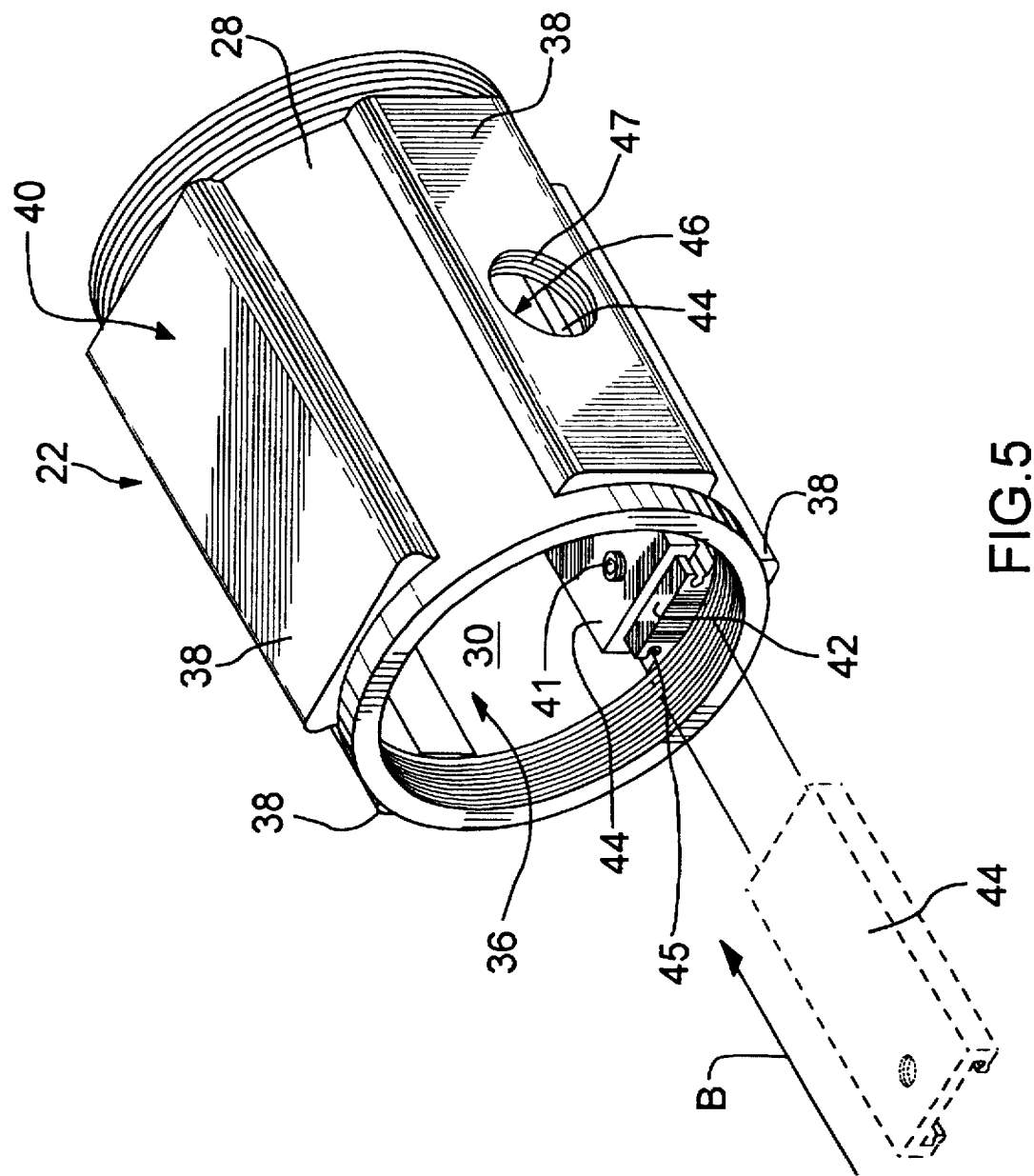

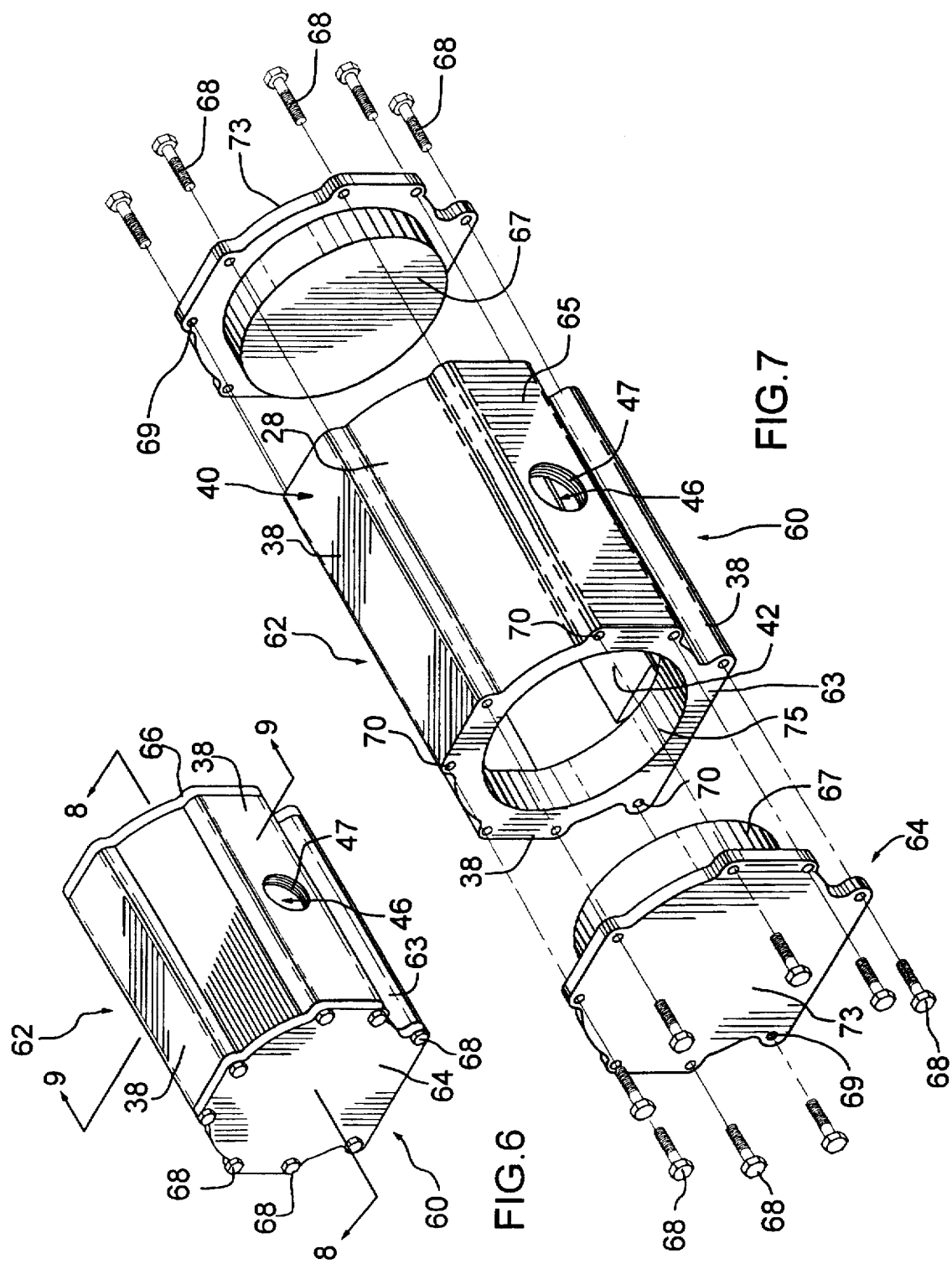

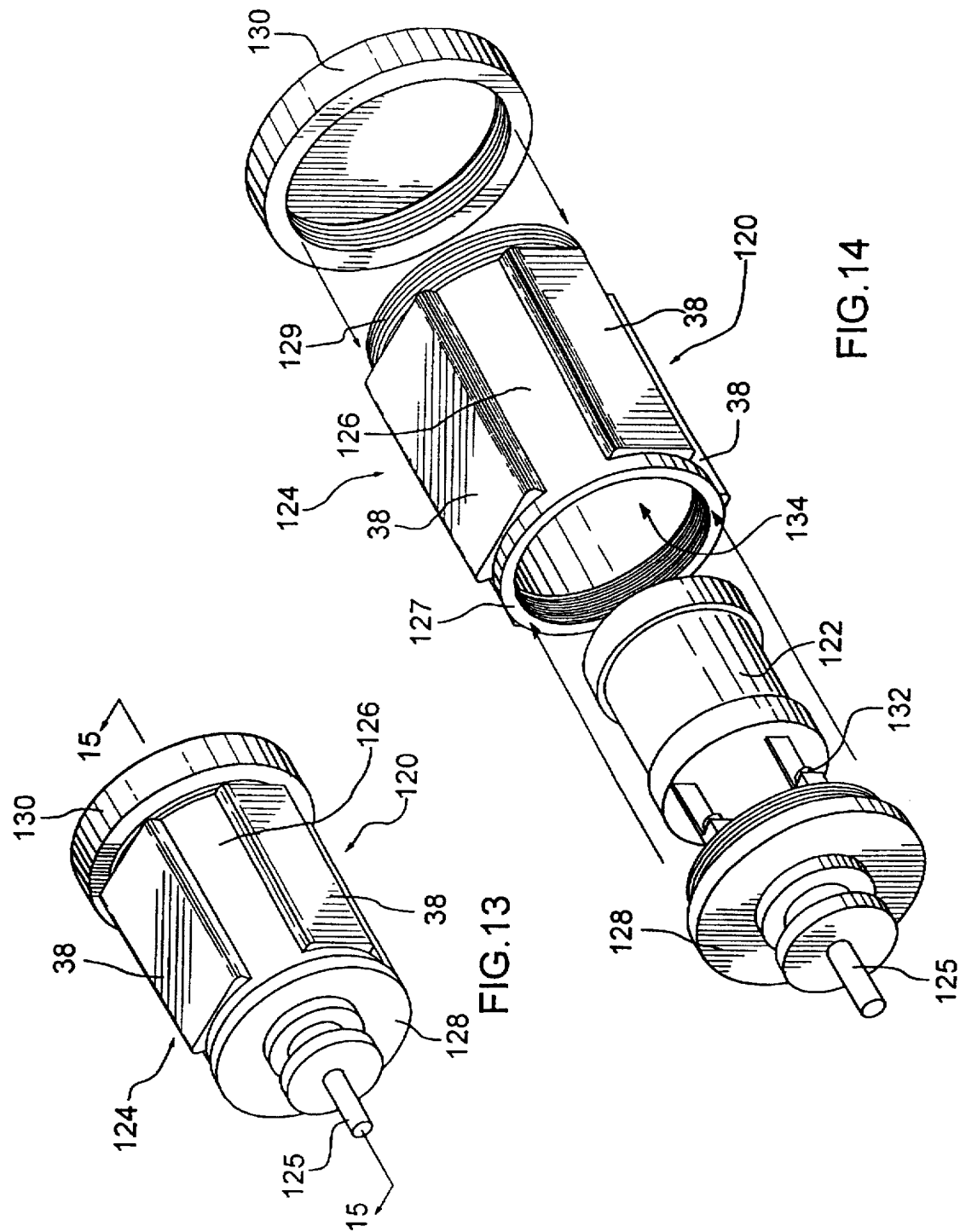

SEALABLE HOUSING FOR ELECTRICAL COMPONENTS

FIELD OF THE INVENTION

The present invention relates to housings for electrical components in industrial applications. More particularly, the present invention relates to housings of the general type designed for use in hazardous environments where they will be subjected to moisture, corrosive substances, flammable substances, or housings for use in situations in which there is a risk of explosion. Additionally, the present invention relates to housings for use in the assembly of explosion proof fractional horsepower motors.

BACKGROUND OF THE INVENTION

Electrical housings are frequently required for a variety of industrial applications. For example, such housings are used for industrial heaters, sealed thermostat housings, control stations, etc. Many such industrial applications require that these housings for electric components be waterproof, flame proof, or explosion proof. For example, an industrial heater for a chemical bath could be used to heat a corrosive material such as an acid. Exposure of the electrical circuitry which controls the industrial heater to the hot acid or to acid fumes could result in the malfunction of the entire heater, with potentially disastrous results. Similarly, where the industrial environment contains potentially explosive materials such as hydrocarbons, an electrical spark could trigger a devastating explosion in the workplace.

Junction boxes and electrical housings for use in such industrial applications must comply with rigorous safety specifications. Previously, in order to meet the required specifications, explosion proof junction boxes were conventionally manufactured of cast metal. Typically, a sand or die casting process would be used to produce cast metal boxes having extremely thick walls formed without seams; however, numerous design limitations result from the inherent character of metal components produced by the casting process. Cast metals are known to be extremely brittle, and frequently have large pores, which pores may be of a size which exceeds acceptable safety tolerance specifications for use in explosion-proof applications. Thus, the metal junction boxes produced from cast metal may be susceptible to stress fractures, cracking, etc. In order to offset the effect of these weaknesses, the prior art cast metal junction boxes were very large and extremely bulky (in order to obtain sufficient wall thickness to overcome defects in the cast metal and to meet minimum strength specifications) relative to the limited interior volume available to facilitate the electrical components and circuitry to be contained therein. The casting process produced a box "blank" which then required further machining, drilling, welding, and brazing to adapt the cast metal blank to fulfil the specifications of a junction box for a given industrial application. For example, if electrical components contained within the housing had to be connected to exterior electrical components, such as heating elements, etc., further holes would have to be drilled into the cast metal box to facilitate the necessary conduits. Such subsequent processing steps frequently resulted in the application of significant stresses to the cast metal blank, and could compromise the structural integrity of the finished cast metal junction box. Accordingly, each round of processing and/or finishing would necessitate renewed hydrostatic testing of the junction box in order to ensure that these additional steps had not subjected the cast metal to undue stresses, which stresses could result in defects undermining the explosion proof characteristics of the finished junction box. Explosion proof junction boxes manufactured using cast metal box structures are not only bulky and heavy, but are expensive to produce, particulary in low volumes, since sand casting requires extensive amounts of original work for each cast structure produced. Moreover, the casting of metal boxes allows for little variation to the size and shape of a particular housing, such that it is cost prohibitive to attempt to customize the cast metal housing boxes for a particular application. Moreover, the subsequent finishing steps of drilling, welding, brazing, etc. of the castings significantly increase the labour cost component of the manufacture of explosion proof electrical housings. Thus, economies of scale were not available to decrease the costs related to labour intensive processes of both the original casting, and the steps of processing and finishing the junction boxes for a particular application. Additionally, the finishing steps increase the risk of creating sub-standard finished products due to stresses generated in the cast metal during finishing.

There are many industrial uses for motors which are maintained in explosion proof housings. Examples of such uses are for driving fans, pumps, motorized valves, etc. designed to be operated in hazardous environments. The conventional processes available for manufacturing explosion proof housings for motors suffer from the same inadequacies as the technology relating to the manufacture of explosion proof electrical housings for other applications, as discussed above. Typically, explosion proof motor housings are constructed of cast metal, and produced according to the conventional methods discussed above. The resulting explosion proof motor housings may be structurally adequate, but are heavy, bulky, and prohibitively expensive, particularly for custom applications.

Accordingly, it is an object of the present invention to provide an electrical housing which overcomes the deficiencies associated with cast metal housings having the desired utility.

More particularly, it is an object of the present invention to provide an electrical housing which is relatively inexpensive to manufacture, yet which meets or exceeds the safety specifications required of moisture proof and explosion proof electrical housings for industrial applications, and which does not require extensive hydrostatic testing in order to prove its structural integrity.

It is yet a further object of the present invention to provide an electrical housing which can be economically manufactured and assembled from substantially modular components to facilitate the customizing of electrical housings for particular industrial applications, even where such applications require the production of relatively low volumes of housings.

It is still a further object of the present invention to provide an electrical housing which can be adapted for use as an explosion proof housing for a fractional horsepower motor.

SUMMARY OF THE INVENTION

In accordance with the present invention there is disclosed a sealable housing for electrical components comprising an extruded main body cut from a raw extrusion and having a first end and a second end. The extruded main body defines a longitudinal axis, and has an outer wall and a substantially cylindrical bore. Two end caps are removably sealably attached, one each to a respective one of the first and second ends of the extruded main body. The end caps, together with the substantially cylindrical bore of the extruded main body, define an electrical component chamber. A means is provided for mounting electrical components within the electrical component chamber.

Other advantages, features and characteristics of the present invention, as well as methods of operation and functions of the related elements of the structure, and the combination of parts and economies of manufacture, will become more apparent upon consideration of the following detailed description and the appended claims with reference to the accompanying drawings, the latter of which is briefly described hereinbelow.

BRIEF DESCRIPTION OF THE DRAWINGS

FIG. 1 of the drawings appended hereto is a perspective view of a preferred embodiment of a sealable housing for electrical components according to the present invention.

FIG. 2 of the drawings is an exploded perspective view of the housing of FIG. 1.

FIG. 5 of the drawings is a side perspective view of the housing of FIG. 2, with the end caps removed to better illustrate a means for mounting electrical components within the cylindrical bore of the housing.

FIG. 6 of the drawings is a perspective view of an alternate embodiment of the sealable housing for electrical components according to the present invention.

FIG. 7 of the drawings is an exploded perspective view of the housing of FIG. 6.

FIG. 13 of the drawings is a perspective view of an explosion proof motor housing representing a fourth embodiment of the present invention.

FIG. 14 of the drawings is an exploded perspective view of the embodiment of FIG. 13.

DETAILED DESCRIPTION OF A PREFERRED EMBODIMENT

Figure 3:
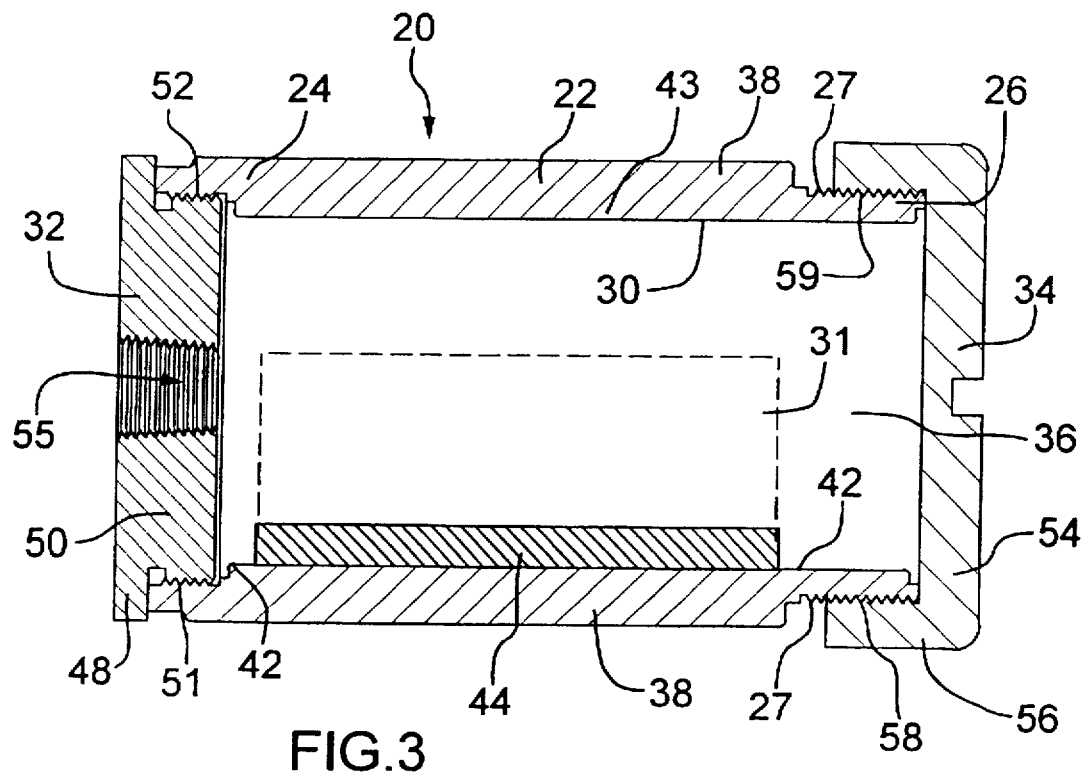
FIG. 3 of the drawings is a longitudinal sectional view of the housing of FIG. 1, taken along line 3—3 of FIG. 1.

Reference will now be made to the drawings, wherein like numerals are used in various Figures to identify analogous structures.

FIG. 1–5 of the drawings show a preferred embodiment of a sealable housing for electrical components 31, which is exemplary of the present invention, and is generally designated by reference numeral 20. The sealable housing 20 has an extruded main body 22 with a first end 24 and a second end 26. The extruded main body 22 defines a longitudinal axis (aligned with line A of FIG. 2). The extruded main body has an outer wall 28 and a substantially cylindrical bore 30. The main body 22, having these basic characteristics, is formed as an integral unit, being a segment of selected length cut from a raw extrusion of indeterminate length and having a cross-sectional extruded shape, which when cut, will form an extruded main body 22 as described above. Preferably, the raw extrusion is comprised of aluminum. The benefits of using an aluminum extrusion are numerous, and certain of these benefits are highlighted as follows. Primarily, an aluminum extrusion of this shape is extremely strong, and will resist deformation even under the application of explosive forces. Aluminum is not as prone to sparking as are structures manufactured from other metals or metal alloys. Moreover, the technologies for working with aluminium are well developed, and it is readily possible to obtain a raw extrusion having the desired shape and strength characteristics from conventional sources. Many electrical connections and fittings are constructed from brass or copper, and the joints between such fittings and an electrical housing could deteriorate due to electrolytic reactions, particularly in moist or corrosive environments. An aluminum extrusion lends itself to anodization which will lessen the effects of electrolytic or other corrosive reactions which could otherwise occur if different metal fittings come into contact with the aluminum.

In the preferred embodiment of FIGS. 1–5, there are additionally provided two end caps 32, 34, each end cap being removably, sealably attached to a respective one of the ends of the main body 22. As shown in FIG. 1, a first end cap 32 is removably, sealably attached to the first end 24 of the main body 22, and the second end cap 34 removably, sealably attached to the second end 26 of the extruded main body 22. Such releasable sealable attachment may be accomplished in two ways, as shown in FIGS. 1 through 5. The strongest manner of attachment, and thus, the manner most likely to resist explosive forces, requires the screw-threaded engagement of the first end cap 32 within the first end 24 of the main body 22. The end cap 32 comprises a substantially planar cover 48, and a screw-threaded attachment 50 depending therefrom. The depending 50 is substantially cylindrical and is threaded 51 around the outer cylindrical perimeter thereof. The cylindrical bore 30 of the first end 24 of the extruded main body 22 is machined round adjacent the first end 24, and internal complementary screw-threading 52 is applied thereto, such that first end cap 32 can be screw-threadingly, removably, sealably engaged into first end 24 of the main body 22.

The second end cap 34 has a planar cover 54 and a depending attachment 56, which attachment 56 defines a substantially annular skirt. The depending attachment 56 has screw-threading 58 on the inner surface of the annular skirt. The second end 26 of the main body has also been machined round, then complementary screw-threading 59 applied to the outer surface 27 of the second end 26 of the main body 22 to facilitate removable sealable screw-threading attachment of the second end cap 34. Screw-threading attachment of the end caps 32, 34 provides superior explosion proof characteristics to the sealable housing 20 for electrical components 31. The preferred embodiment of FIGS. 1–5 is exemplary of both possible methods of screw threadingly engaging end caps 32, 34 to the main body 22. It should be readily understood, however, that in order to meet the requirements of any given application, the end caps could be removably, sealably attached as shown in FIGS. 1–5, or both ends of the main body 22 could be machined in a like manner, so as to provide for the screw threaded engagement of the same type of end cap (ie., either internally screw threaded, or externally screw threaded) on both ends 24, 26 of the main body. Moreover, screw threaded engagement of end caps to the. ends of the housing 20 with the aid of gaskets or "O"-rings (not shown) will provide protection against moisture infiltration into the bore 30 of the housing 20, which may be important in certain applications.

The end caps 32, 34, together with the substantially cylindrical bore 30 of the extruded main body 22 define an electrical component chamber 36. There is further provided means for mounting electrical components 31 within the electrical component chamber 36 of the sealable housing 20, which means may be positioned on the substantially cylindrical bore 30, or on at least one of the two end caps 32, 34, as will be discussed in greater detail below.

Figure 4:
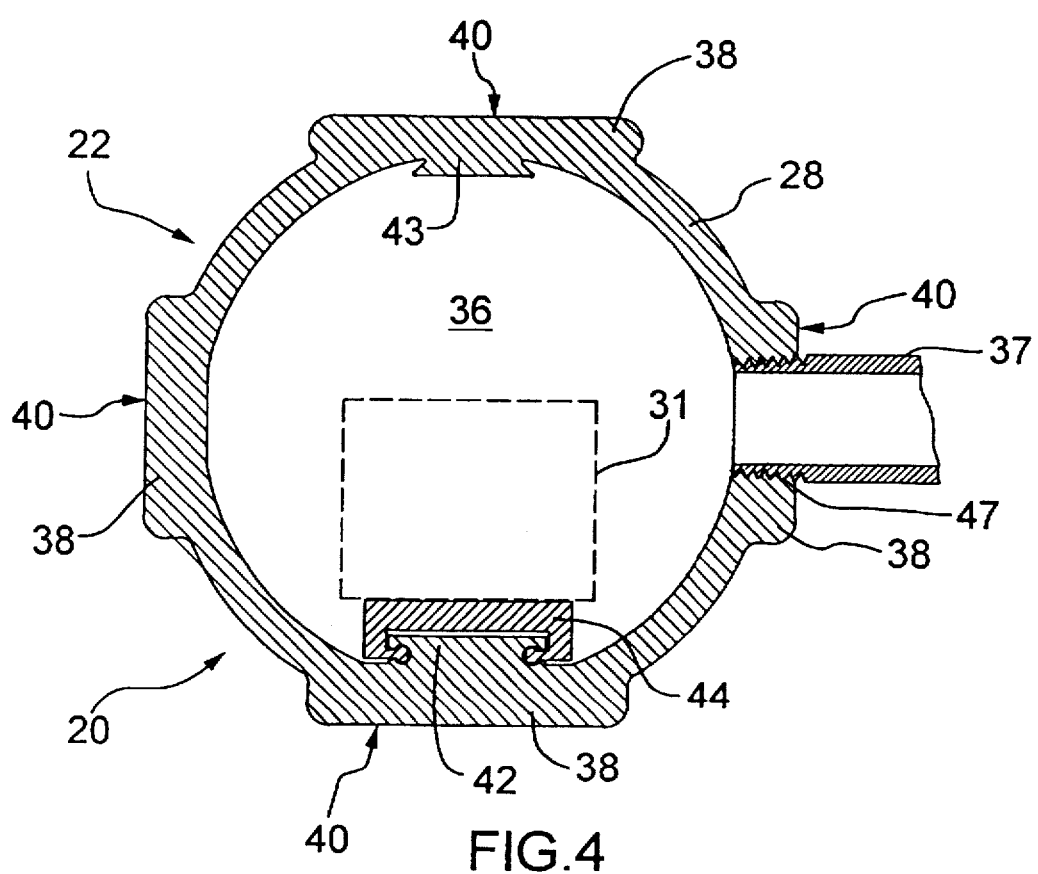
FIG. 4 of the drawings is a cross-sectional view of the housing of FIG. 1, taken along line 4—4 of FIG. 1.
Figure 8:
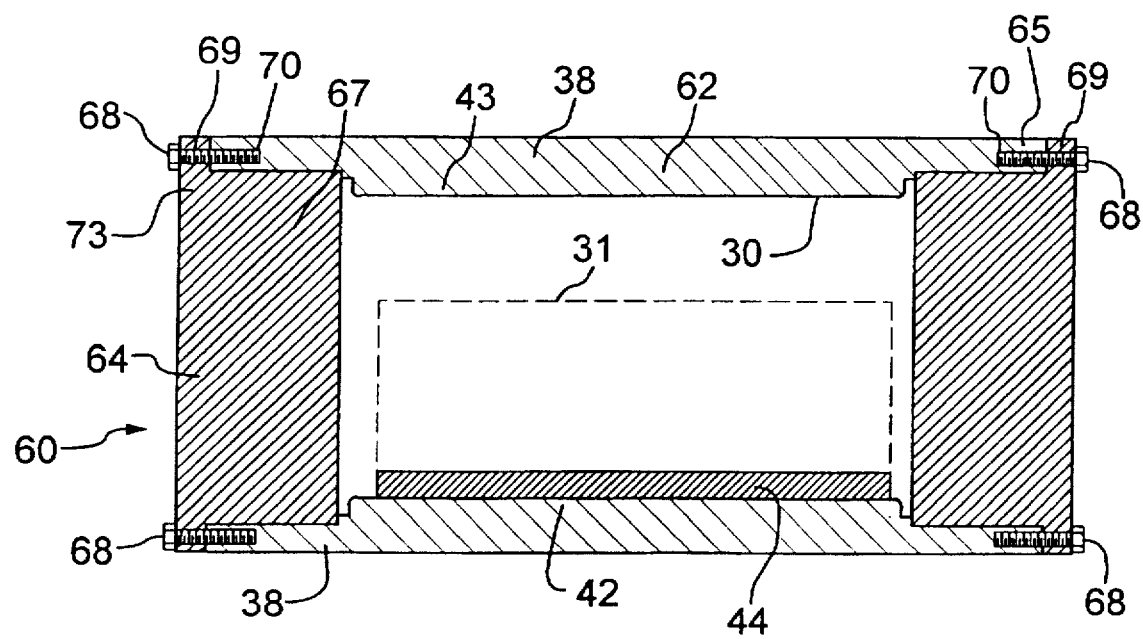
FIG. 8 of the drawings is a longitudinal sectional view of the housing of FIG. 6, taken along line 8—8 of FIG. 6.
Figure 9:
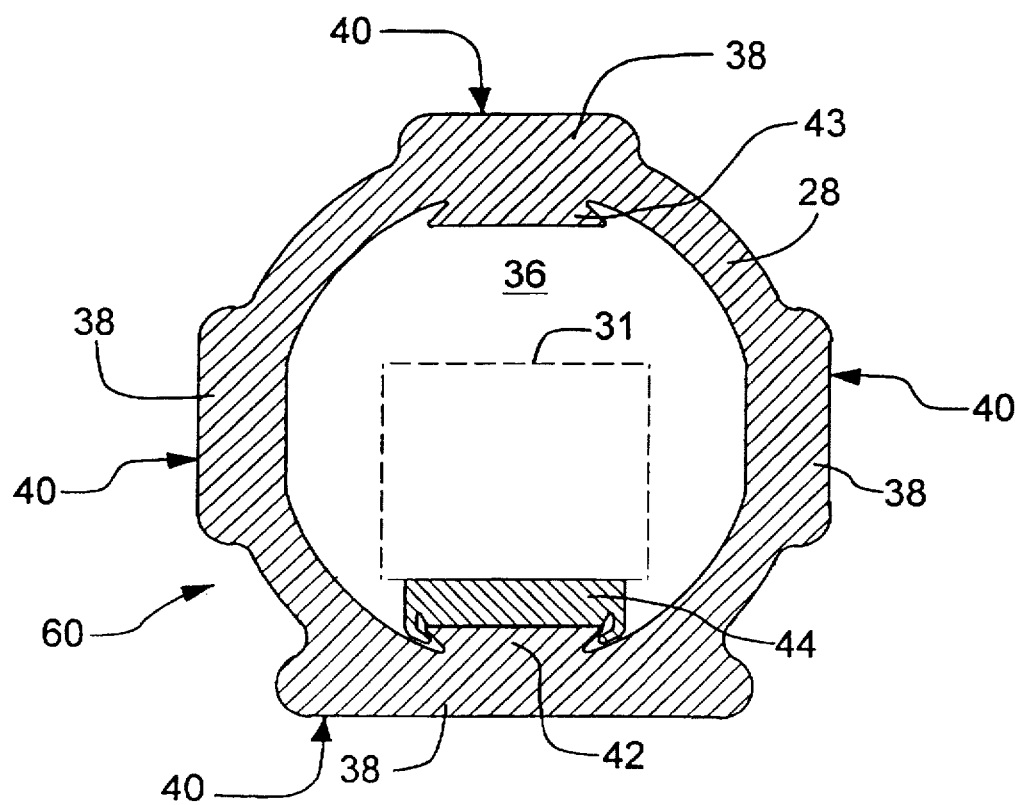
FIG. 9 of the drawings is a cross-sectional view of the housing of FIG. 6, taken along line 9—9 of FIG. 6.
Figure 10:
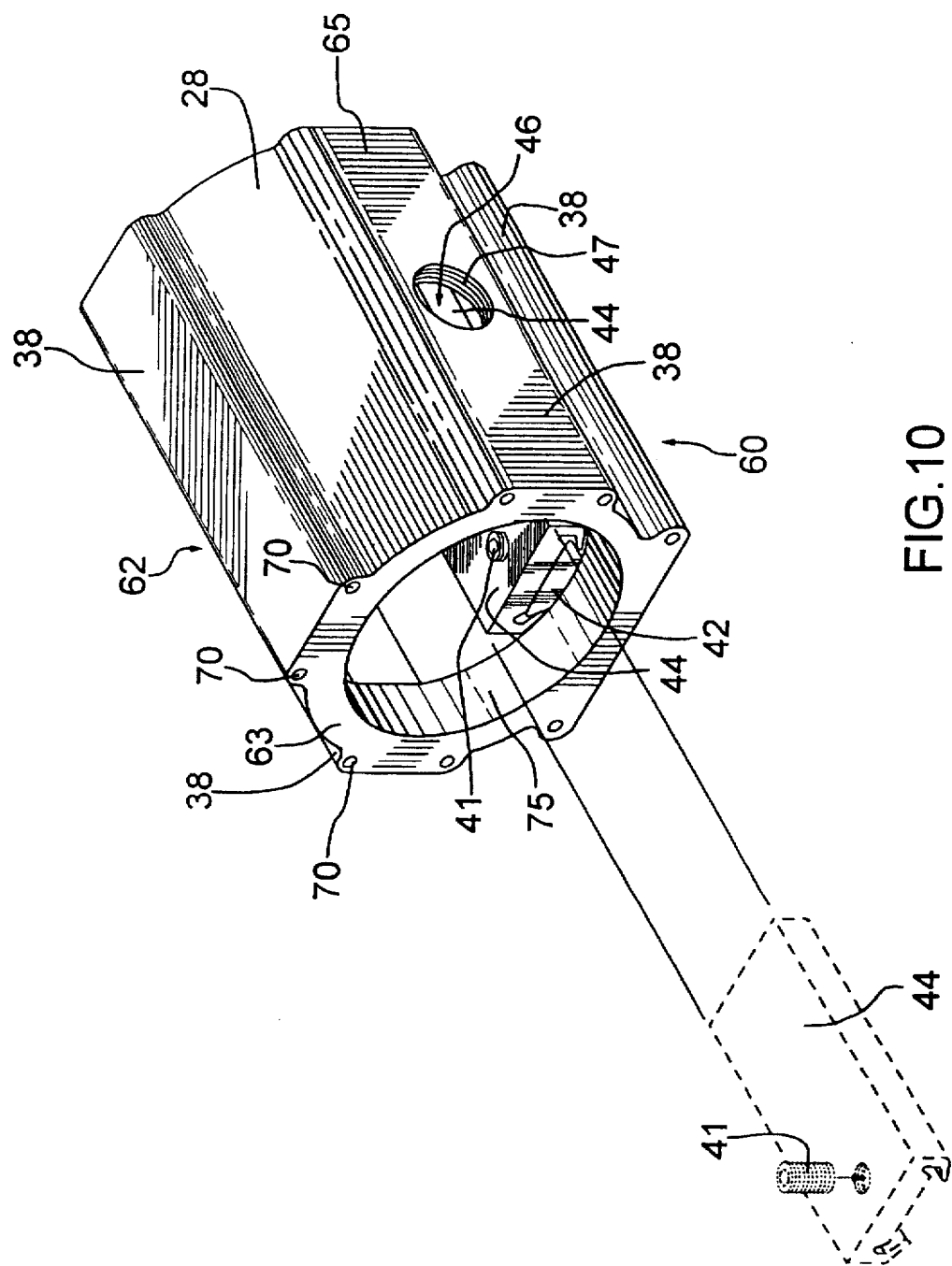
FIG. 10 of the drawings is a side perspective view of the housing of FIG. 6, with the end caps removed to better illustrate the means for mounting electrical components within the cylindrical bore of the housing.

The extruded main body 22 of the sealable housing 20 features one or more thickened longitudinal outer wall segments 38, each of which thickened longitudinal outer wall segments 38 extends radially outwardly from the cylindrical bore 30. As best seen in FIG. 4, the extruded main body 22 preferably has two orthogonally spaced pairs of such thickened longitudinal outer wall segments 38,38,38,38 extending radially outwardly from the cylindrical bore 30. Each of the thickened longitudinal outer wall segments 38 has a generally planar outer surface 40. The generally planar outer surface 40 is arranged in a substantially tangential relation to the substantially cylindrical bore 30. Thus, the generally planar outer surfaces 40 of the thickened longitudinal outer wall segments 38 present rectangular surfaces, which surfaces 40 are advantageous for the positioning, alignment and drilling of passageways therethrough. The extruded main body 22 may have one or more passageways 46 through the outer wall 28 to provide communication with the electrical component chamber 36, or to permit the installation of pilot lights, push buttons, switches, etc. Electrical components 31 contained within the electrical component chamber 36 can then be connected to other electrical apparatus (not shown) located outside of the housing 20, by means of the threaded conduit 37, which conduit 37 sealably engages the passageway 46, as shown in FIGS. 1 and 2. The passageway 46 is adapted with screw-threading 47 in order to provide for sealably screw-threaded engagement of conduit 37 into the extruded main body 22. The passageway 46 is drilled through one of the thickened longitudinal outer wall segments 38 of the outer wall 28 of the extruded main body 22. While only one passageway 46 is shown in the Figures, a plurality thereof can be drilled and tapped through the main body 22 as required by the particular application. The positioning of the passageways 46 on the thickened outer wall segments 38 is critical, since the thickened longitudinal outer wall segments 38 will provide additional strength at these positions such that the drilling of holes through the outer wall 28 does not significantly reduce the strength of the main body 22, but rather the loss of material due to the drilling is compensated for by extra material provided by the thickened longitudinal outer wall segments 38. The overall ability of the sealable housing 20 to withstand explosive forces is only as great as the strength of the weakest point on the sealable housing 20. If openings 46 were drilled through the outer wall 28 of the main body 22 at other positions not reinforced by the thickened longitudinal outer wall segments 38, then the overall strength of the sealable housing 20 would be compromised. Furthermore, in order to be considered explosion proof, metal to metal joints must have a minimum contact length (usually between 9 mm and 25 mm) as required in safety standards codes, such as the Canadian Electrical Code or the U.S. National Electrical Code. Such minimum contact length can be ensured by providing a pre-determined number of threads at any given connection site. By drilling and tapping the passageways 46 through the thickened longitudinal outer wall segments 38, there will be sufficient depth available to tap the required number and size of threads to meet safety specifications for connections which will be exposed to hazardous and/or explosive environments. Moreover, the second mounting track 43 can additionally be used to further reinforce one or more passageways 46. If such a passageway is drilled and tapped through both the second mounting track 43 and the thickened longitudinal outer wall segment 38 in register therewith, then the passageway will be of sufficient length to facilitate the throughpassage of an operating rod or shaft (not shown). The operating rod could then be used to control or reset the electrical component 31 (such as a thermostat) mounted inside the housing 20.

When it is desired that the means for mounting the electrical components 31 be positioned on a substantially cylindrical bore 30, this means preferably takes the form of a first longitudinally extending mounting track 42, which mounting track 42 is contiguous with the extruded main body 22, and which projects radially inwardly toward the centre of the substantially cylindrical bore 30 at a position in register with the positions of the thickened longitudinal outer wall segments 38 of the extruded main body 22. The mounting track 42 has a complementary cross-sectional contour (as best seen in FIG. 4) which is adapted to engage a longitudinally interfitting trolley means 44. The electrical components 31 (represented in FIGS. 3 and 4 in phantom outline) for a selected application are conventionally affixed to the trolley means 44, and the trolley means 44, is then longitudinally interfitted onto the mounting track 42 on the substantially cylindrical bore 30, as indicated by arrow B of FIG. 5. The trolley means 44 is preferably held in place at a selected position along the mounting track 42 by tightening of a set screw 41, or other similar means. Additionally, as shown in FIG. 2, the mounting track 42 is contoured to have a lateral groove 45, which groove 45 is adapted to receive a grounding screw (not shown), which can be used to ground the electrical components 31 to the main body 22 of the housing 20.

The extruded main body 22 is preferably extruded with a second longitudinally extending mounting track 43 (best seen in FIG. 4) which projects inwardly from the extruded main body 22 at a position on the substantially cylindrical bore 30 in register with the positioning of one of the thickened longitudinal outer wall segments 38 of the outer wall 28 of the extruded main body 22, and diametrically opposed to the position of the first mounting track 42. The second longitudinally extending mounting track 43 has a complementary cross-sectional contour similar to the mounting track 42, which, if required, is adapted to engage a second longitudinally interfitting trolley means (not shown). The existence of the second mounting track 43 allows for the possibility of employing a most desirable mounting position within the sealable housing 20 by choosing either the first 42 or second 43 mounting tracks for longitudinal interfitting engagement with the trolley means 44. Moreover, in applications where numerous relatively small electrical components 31 are to be mounted within the sealable housing 20, each of the mounting tracks 42 and 43 can be longitudinally interfitted with its own trolley means having electrical components 31 attached thereto. Thus this arrangement allows great flexibility in the mounting of electrical components within the sealable housing 20 in a manner which does not interfere with the structural integrity of the housing 20, but rather augments such integrity.

A screw-threaded passage 55 may optionally be provided in the first end cap 32 to permit communication with the electrical component chamber 36. The screw-threaded passage 55 is frequently used for the connection of conduits or cable fittings necessary for operative engagement with the electrical components 31 contained in the electrical component chamber 36. Alternatively, the screw-threaded passage 55 could serve as a mounting means on the end cap for electrical components 31, as follows. The passage 55 can screw-threadingly receive a threaded coupling (not shown) to provide for the suspension of external electrical components (not shown) from the threaded coupling with the connection wires running through the coupling into the electrical component chamber 36.

Reference is now made to FIGS. 6 through 10, in which an alternate embodiment of the sealable housing for electrical components 31 is shown and indicated by the general reference numeral 60. This embodiment is substantially similar to that of FIGS. 1 through 5, but the alternate embodiment presents an example of a variation in the manner by which the extruded main body 62 and each of the first 64, and the second 66 end caps are removably sealably attached. Each of the first 64 and second 66 end caps has an outer perimeter shape which corresponds to the cross-sectional perimeter shape of the main body 62. The end caps 64, 66 each further comprise a substantially planer cover plate 73 adapted with a plurality of bolt receiving channels 69 therethrough, which bolt receiving channels 69 are positioned in register with corresponding bolt receiving means 70 in both ends of the main body. Each end cap 64, 66 additionally has a depending substantially cylindrical insert plug 67, which insert plug 67 has a selected length which is sufficient to meet safety code requirements for the minimum joint length in a metal-to-metal seal. The insert plug s 67,67 are each dimensioned to closely fit within a respective cylindrical collar 75, created in the first 63 and second 65 ends of the main body 62 by machining round the original extrusion to remove a of each of the mounting tracks 42, 43 in order to receive the insert plug 67 of each end cap in closely fitting relation.

Each of the end caps 64, 66 are removably sealably attached to the extruded main body 62 by means of bolts 68. Each of the first end 63 and the second end 65 of the extruded main body 62 has a plurality of longitudinal bolt receiving means 70 therein. The bolt receiving means 70, preferably being threaded bolt sockets, are positioned in the thickened longitudinal outer wall segments 38 of the main body 62, as best seen in FIG. 7. The positioning of the bolt receiving means 70, in these thickened longitudinal outer wall segments 38 ensures that the overall strength of the housing 60 is not compromised by the drilling of the bolt receiving means 70 through non-reinforced locations on the main body 62. Furthermore, the positioning of the bolt receiving means 70 in the thickened longitudinal outer wall segments 38 permits the use of bolts 68 which have a larger diameter, and are, thus, capable of withstanding the tensile forces which would be caused in the event of the explosion of gas within the housing 60. Accordingly, the resistance to rupture of the housing 60 upon an internal explosion is maximized. Gaskets (not shown) may be optionally inserted between the end caps 64, 66 and the respective ends 63 of the main body 62, if needed to ensure moisture proof sealing.

The sealable housing 60 for electrical components 31 additionally comprises a means for mounting the electrical components 31 within the electrical component chamber 36. The electrical component chamber 36 is formed in the same manner as the corresponding chamber 36 of the housing 20 of the preferred embodiment, and the means for mounting the electrical components 31 within the electrical component chamber 36 are to that described above with reference to the preferred embodiment of FIGS. 1-5.

The second embodiment illustrated in FIGS. 6-10 is manufactured in a similar manner to that of preferred embodiment, although the sealing of the end caps and physical characteristics is of this alternate embodiment may be slightly less robust than those of the preferred embodiment of FIGS. 1-5. That is, the absence of full screw-threading engagement of the end caps, and the substitution of bolts 68 or other suitable fastening means in the alternate embodiment of FIGS. 6-10, may result in a sealable housing 60 for electrical components 31 which is somewhat less resistant to explosion than a sealable housing in which the end caps are screw-threadingly engaged to the main body. The alternate embodiment is advantageous in that it can be used in situations where the screw threaded attachment of end caps is not feasible. For example, if an electrical component 31 is to be mounted within the housing 60 by a mounting means located on one end cap, and the electrical component 31 is pre-wired, then the rotation of the end cap required for screw threaded attachment would result in twisting of the wires connected to the electrical component 31. By attaching the end caps 64, 66 using bolts 68, in accordance with the alternate embodiment of the present invention, the limitations of screw threaded attachment can be overcome.

Figure 11:
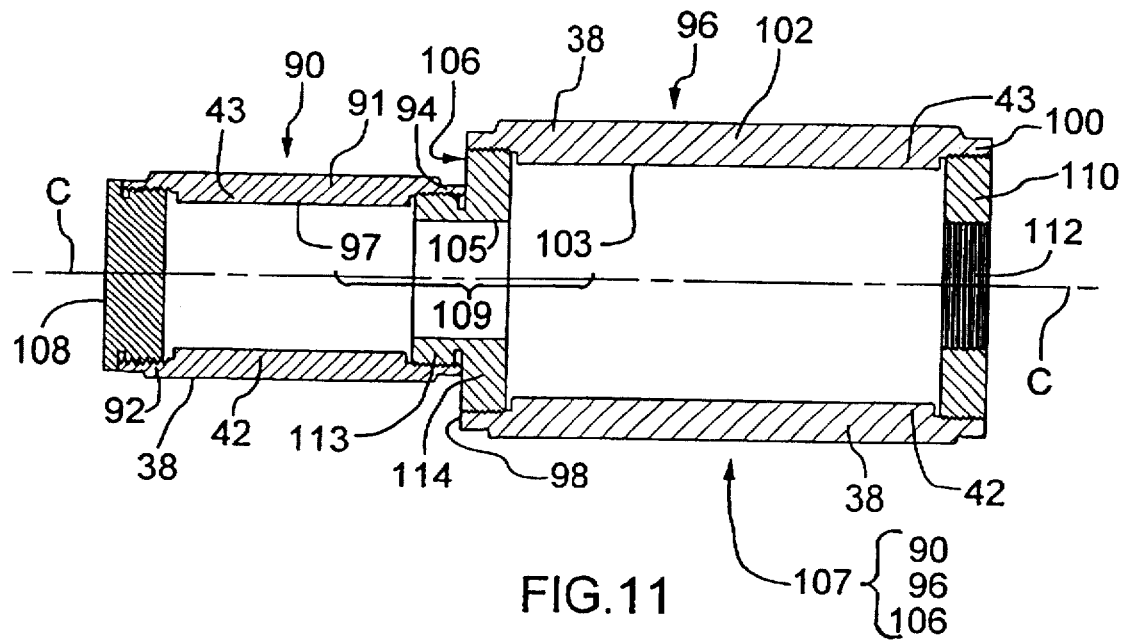
FIG. 11 of the drawings is a longitudinal sectional view of a third embodiment of a sealable housing for electrical components according to present invention.
Figure 12:
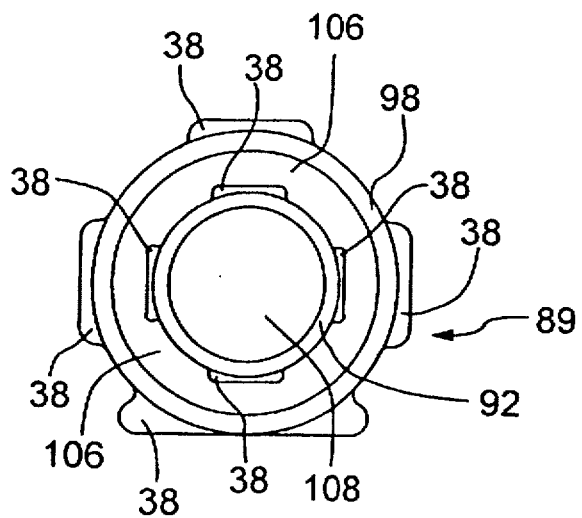
FIG. 12 of the drawings is an elevational end view of a first end of the housing of FIG. 11.

In instances where large amounts of electrical equipment must be housed within a sealable housing, the housing can simply be made larger to accommodate the necessary components 31, either by initially selecting a long segment of raw extrusion from which to form the main body having the desired longitudinal length, or by selecting and coupling two or more main bodies, each such main body formed from a segment of raw extrusion of the same or differing diameters. A further alternate embodiment of a sealable housing for electrical components 31 is shown in FIGS. 11 and 12, wherein it is generally indicated by the reference numeral 89. In this further embodiment, two extruded main bodies 90 and 96 of different diameters are shown. Each of the extruded main bodies 90 and 96 has a respective first end 92, 98, and a respective second end 94, 100. The extruded main bodies 90, 96 are co-axial and define a longitudinal axis indicated by line C in FIG. 11. The main body 90 has an outer wall 91 and a substantially cylindrical bore 97. The main 96 has an outer wall 102 and a substantially cylindrical bore 103. A substantially annular coupling means 106 is interconnected between the second end 94 of the first main body 90 and the first end 98 of the second main body 96 thereby to form a composite main body 107. The coupling means 106 has external screw threading at each of its axially opposed ends to operatively engage complementary internal screw threading on the respective ends 94, 98 of each of the first 90 and second 96 extruded main bodies between which the coupling means 106 is interconnected. The two end caps 108 and 110 are removably sealably attached to the remaining respective ends 92, 100 by means of complementary screw threading, as shown. As illustrated in FIG. 11, end cap 108 is removably sealably attached to the first end 92, and end cap 110 is removably sealably attached to the second end 100. Ends 92 and 100 additionally form the opposite ends of the composite main body 107. In this manner, a composite substantially cylindrical bore 109 is formed, being comprised of the substantially cylindrical bore 97 of first end 90, the substantially cylindrical bore 103 of second main body 102, and the substantially cylindrical bore 105 of the coupling means 106. The end caps 108 and 110, together with the composite substantially cylindrical bore 109, together define a composite electrical component chamber of the housing 89. Means are additionally provided for mounting selected electrical components 31 within the composite electrical component chamber, in an analogous manner to that previously discussed in relation to the embodiment of FIGS. 1–5, positioned in either or both of the first main body 90 or the second main body 100, depending upon the desired characteristics of the particular electrical components 31 to be housed within the sealable housing 89.

In FIGS. 11 and 12, the first main body 90 and the second main body 96 are of differing cross-sectional diameters. The coupling means 106 has a first annular connector 113 of a small diameter, and a second annular connector 114 of a substantially larger diameter than that of connector 113. Both of the annular connector 113 and 114 are longitudinally contiguous with one another and have an inner bore 105 of uniform diameter. Each of the connector 113 and 114 has screw threading which on their respective outer perimeter 115, 116 engages with complementary screw threading on the ends 94 and 98 of the two extruded main bodies 90 and 96.

Figure 15:
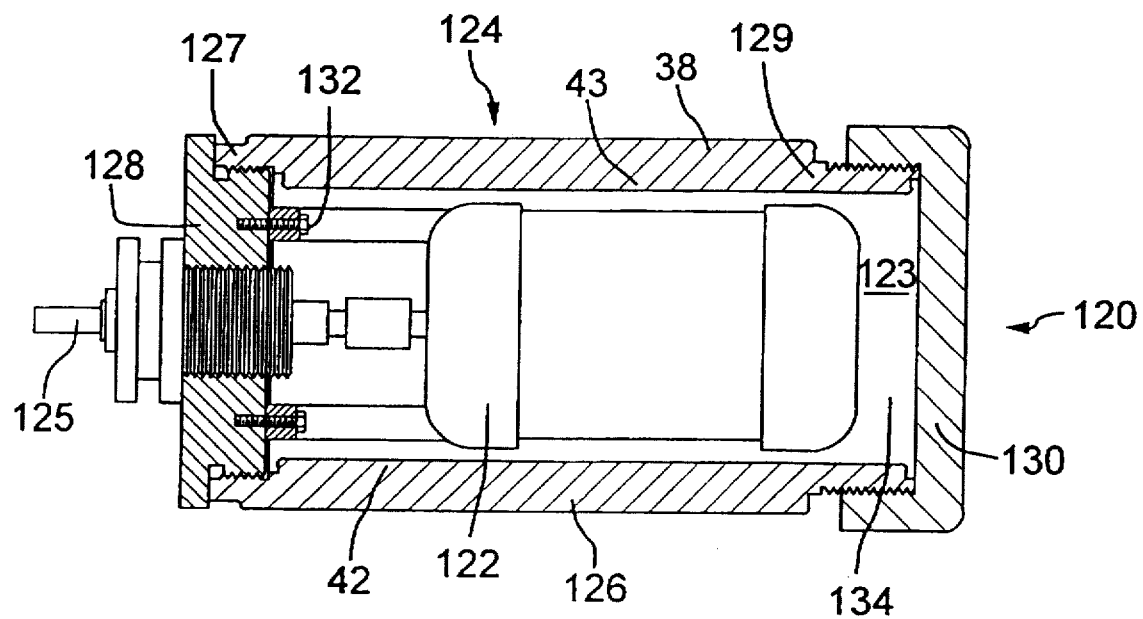
FIG. 15 of the drawings is a longitudinal sectional view of the explosion proof motor housing of FIGS. 13 and 14, taken along line 15—15 of FIG. 13.

A sealable housing for electrical components constructed according to principles of the present invention is additionally highly effective for use in the manufacture of explosion proof fractional horsepower electric motors. As shown in FIGS. 13, 14, and 15, a segment of the raw extrusion can be obtained and assembled in a manner analogous to that of the sealable housings of the other embodiments discussed above, in order to create an explosion proof motor unit as indicated by the general reference 120. The explosion proof motor consists of a conventional fractional horse power motor 122 retained within a explosion proof motor housing 124. The drive shaft 125 of the motor 122 protrudes, as shown, from the end cap 128 of the explosion proof motor housing 124. Alternatively, the drive shaft 125 could be coupled through the use of a suitable motor shaft operator. The housing 124 is comprised of an extruded main body 126 which is constructed from a segment of the raw aluminium extrusion having a substantially cylindrical bore 30 as described hereinabove. The extruded main body 126 has a first end 127 and a second end 129, both of which ends 127,129 are screw-threaded, the first end internally and the second end 129, externally. A first end cap 128 is externally threaded for removable sealable screw-threaded engagement to the first end 127. A second end cap 130 is internally threaded for removable sealable screw-threaded engagement to the second end 129 of the main body 126. A mounting means, such as bolts 132, 132 connect the fractional horse power motor 122 to the first end cap 128. Additionally, the motor 122 could be attached and supported on a trolley means (not shown) longitudinally interfitted to a mounting track 42 within the bore 123, in a manner analogous to the track and trolley mounting means discussed above. The fractional horse power motor 122 is thus retained within a motor chamber 134, which chamber is formed by the substantially cylindrical bore 123 of the extruded main body 126, together with the removably sealably screw-threaded first 128 and second 130 end caps.

The sealable housing for electrical components of the present invention can be modified in numerous ways relating to the manner of connection of the end caps to the main body, the particular means used to mount the selected electrical components within the housing, the size of housing required, and the presence or absence of passageways in the main body of the housing to permit the sealed insertion of further conduits for electrical circuitry, etc. Thus, the selection of the particular parameters for any given sealable housing for electrical components according to the present invention will be routinely determined by the particular application for which the housing is being constructed.

Although aluminum is the preferred metal from which to form the raw extrusion, other metals and/or metal alloys such as steel, copper, tin, etc., may also be suitable for certain applications. Moreover, if a light weight housing is required, and explosion proof and/or flame proof characteristics are not required, then instead of an aluminum extrusion it may be possible to use an extrusion of a heavy plastic material to form the main body, and end caps of a corresponding material could additionally be used. Suitable plastics materials could include polyester, polycarbonate, and ABS plastic.

A further variation in the nature of the end caps can be employed in situations where moisture resistance is required, but where there is no requirement that the housing be explosion proof. An end cap can be produced as a substantially planar cover plate having bolt channels therethrough, the bolt channels being positioned in register with the bolt receiving means drilled into each end of the main body of the housing. Two such cover plate type end caps can then secured, one to each end of main body of the housing by bolts which are which pass through the bolt channels and are fastened into the bolt receiving means in each end of the main body. Gaskets may optionally be inserted between the respective ends of the main body and the cover plate type end caps, to ensure effective sealing.

Moreover, routine variations and dimensions, shaping, choice material, arrangement and substitution of parts will occur to those skilled in the art, such that the scope of this invention is limited only by the scope of the appended claims which follow.

We claim:

1. A sealable housing for electrical components comprising:

an extruded main body cut from a raw extrusion and having a first end and a second end, said extruded main body defining a longitudinal axis, and having an outer wall and a substantially cylindrical bore;

two end caps, each of said end caps being removably sealably attached to a respective one of said first and second ends of said extruded main body;

said end caps, together with the substantially cylindrical bore of said extruded main body, defining an electrical component chamber; and, a means for mounting the electrical components within the electrical component chamber.

2. The housing of claim 1 wherein the extruded main body further comprises one or more thickened longitudinal outer wall segments extending radially outwardly from said cylindrical bore.

3. The housing of claim 1 wherein the extruded main body further comprises at least one pair of thickened longitudinal outer wall segments extending radially outwardly from said cylindrical bore at positions diametrically opposed from one another across said bore.

4. The housing of claim 1 wherein the extruded main body further comprises two orthogonally spaced pairs of thickened longitudinal outer wall segments extending radially outwardly from said cylindrical bore.

5. The housing of claim 2 wherein each of the thickened longitudinal outer wall segments has a generally planar outer surface arranged in substantially tangential relation to said bore.

6. The housing of claim 1, wherein the means for mounting the electrical components is positioned on at least one of said two end caps.

7. The housing of claim 1, wherein the means for mounting the electrical components is positioned on said substantially cylindrical bore.

8. The housing of claim 7, wherein the means for mounting the electrical components comprises a first longitudinally extending mounting track contiguous with the extruded main body and projecting radially inwardly toward the centre of said substantially cylindrical bore, said mounting track having a complementary cross-sectional contour adapted to engage a longitudinally interfitting trolley means, said trolley means having the electrical components mounted thereon.

9. The housing of claim 8, wherein the first longitudinally extending mounting track projects inwardly from the extruded main body at a position on the bore in register with the positioning of one of said thickened longitudinal outer wall segments of the extruded main body.

10. The housing of claim 9, further comprising a second longitudinally extending mounting track projecting inwardly from the extruded body at a position on the bore diametrically opposed to the position of the first mounting track.

11. The housing of claim 2, wherein the extruded main body has one or more passageways through the outer wall of said main body to provide communication with the electrical component chamber, thereby to permit the connection of the electrical components contained within the electrical component chamber to electrical apparatus located outside the housing, or the installation of cooperating mechanical or electrical components within said one or more passageways.

12. The housing of claim 11, wherein said one or more passageways through said outer wall pass through one or more of the thickened longitudinal outer wall segments.

13. The housing of claim 12, wherein said one or more passageways through said outer wall pass through a longitudinally extending mounting track projecting inwardly from the extruded main body.

14. The housing of claim 1 wherein the end caps are removably sealably, screw-threadingly engaged to the respective first and second ends of said extruded main body.

15. The housing of claim 14, wherein the end caps comprise: a substantially planar cover and a screw-threaded attachment depending therefrom.

16. The housing of claim 15, wherein said depending attachment defines a substantially annular skirt, and said skirt is threaded about an inner surface thereof.

17. The housing of claim 16, wherein said depending attachment is substantially cylindrical, and is threaded about the outer cylindrical perimeter thereof.

18. The housing of claim 15, wherein said substantially planar cover has a central conduit opening therethrough.

19. The housing of claim 2, wherein the end caps are removably sealably attached to the extruded main body by means of bolts.

20. The housing of claim 19, wherein the respective ends of the extruded main body have a plurality of longitudinal bolt receiving means therein, said bolt receiving means being positioned in said thickened longitudinal outer wall segments, and wherein the end caps have a corresponding plurality of longitudinal bolt channels therethrough, said bolt channels positioned so as to be registrable with the plurality of longitudinal bolt receiving means in the extruded main body.

21. The housing of claim 11, wherein the passageways through the wall are internally threaded to screw-threadingly accept, in sealed relation, complementary coupling means attached to said electrical apparatus located outside the housing.

22. The housing of claim 1, wherein the extruded main body is constructed from aluminum.

23. The housing of claim 22, wherein the extruded main body is anodized on at least its outer wall.

24. The housing of claim 1, wherein the extruded main body is constructed from a plastics material.

25. A sealable housing for electrical components comprising:

two extruded main bodies, each of said extruded main bodies having a first end and a second end, each of said extruded main bodies defining a longitudinal axis, and having an outer wall and a substantially cylindrical bore;

at least one coupling means interconnected between the second end of one of said extruded main bodies and the first end of the other extruded main body thereby to form a composite main body;

two end caps, each of said end caps being removably sealably attached to the remaining respective ones of said ends;

said end caps, together with the substantially cylindrical bore of said composite extruded main body, defining a composite electrical component chamber; and, a means for mounting the electrical components within the composite electrical component chamber.

26. The housing of claim 25, wherein said coupling means is substantially annular, and has screw threading to operatively engage complementary screw threading on respective ends of each of the first and second extruded main bodies between which said coupling means is interconnected as aforesaid.

27. The housing of claim 26, wherein said coupling means has a first annular connector of substantially small diameter, and a second annular connector of substantially larger diameter, both of said annular connector portions being longitudinally contiguous with one another and having an inner bore of uniform diameter, and wherein said screw threading is positioned on the outer perimeter of the first annular connector and on the outer perimeter of the second annular connector portion.

* * * * *